(12) United States Patent
Edakkuttathil Muhammed et al.

(10) Patent No.: US 9,722,622 B2
(45) Date of Patent: Aug. 1, 2017

(54) LOW PARASITIC CAPACITOR ARRAY

(71) Applicant: Texas Instruments Incorporated, Dallas, TX (US)

(72) Inventors: Gehesh Edakkuttathil Muhammed, Bangalore (IN); Naveen KV, Bangalore (IN); Arun Mohan, Bangalore (IN); Shagun Dusad, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/136,368

(22) Filed: Apr. 22, 2016

(65) Prior Publication Data

US 2016/0315630 A1 Oct. 27, 2016

(30) Foreign Application Priority Data

Apr. 24, 2015 (IN) .......................... 2107/CHE/2015

(51) Int. Cl.

| | |
|---|---|
| *H03M 1/12* | (2006.01) |
| *H01L 23/522* | (2006.01) |
| *H01L 27/08* | (2006.01) |
| *H01G 4/30* | (2006.01) |
| *H03M 1/80* | (2006.01) |
| *H01G 4/38* | (2006.01) |
| *H01L 49/02* | (2006.01) |

(52) U.S. Cl.
CPC ................. *H03M 1/12* (2013.01); *H01G 4/38* (2013.01); *H01L 23/5223* (2013.01); *H01L 27/0805* (2013.01); *H01G 4/30* (2013.01); *H01G 4/385* (2013.01); *H01L 28/90* (2013.01); *H03M 1/804* (2013.01)

(58) Field of Classification Search
CPC .......... H03M 1/804; H03M 1/12; H01G 4/30; H01G 4/385
USPC ........... 341/172, 120, 155; 361/306.3, 321.2, 361/303
See application file for complete search history.

(56) References Cited

U.S. PATENT DOCUMENTS

| | | | | |
|---|---|---|---|---|
| 2011/0069425 | A1* | 3/2011 | Hsu ........................ | H01L 22/22 361/330 |
| 2011/0095930 | A1* | 4/2011 | Buter .................. | H03M 1/0614 341/172 |

* cited by examiner

*Primary Examiner* — Joseph Lauture
(74) *Attorney, Agent, or Firm* — John R. Pessetto; Charles A. Brill; Frank D. Cimino

(57) ABSTRACT

The disclosure provides a capacitor array. The capacitor array includes one or more first metal plates vertically stacked parallel to each other. A second metal plate is horizontally stacked to couple one end of each first metal plate of the one or more first metal plates. One or more third metal plates are vertically stacked parallel to the one or more first metal plates. Each third metal plate of the one or more third metal plates is stacked between two first metal plates.

20 Claims, 3 Drawing Sheets

LOW PARASITIC CAPACITOR ARRAY

CROSS REFERENCES TO RELATED APPLICATIONS

This application claims priority from India provisional patent application No. 2107/CHE/2015 filed on Apr. 24, 2015 which is hereby incorporated by reference in its entirety.

TECHNICAL FIELD

The present disclosure is generally related to a capacitor array, and more particularly to a low parasitic capacitor array.

BACKGROUND

Capacitor arrays or capacitor ladders are commonly used in the analog-to-digital converters (ADCs), digital-to-analog converters (DACs), switched capacitor filters and similar applications. A capacitor array includes a plurality of capacitors arranged in parallel. There are multiple requirements for a capacitor array, such as: (a) top plate to bottom plate capacitance of each capacitor in the capacitor array should be same; (b) minimum extension of the capacitor array in the X direction as it directly affects top level floor plan; and/or (c) a parasitic capacitance between top plate and bottom plate of each capacitor should be minimum.

In an ADC, top plates of the plurality of capacitors are coupled together, and also coupled to an amplifier. The bottom plate of each capacitor of the plurality of capacitors is coupled to at least one of a ground voltage and a reference voltage. A value of capacitance between top plate and bottom plate of each capacitor in the capacitor array is required to be of same value. When this condition is met, the capacitor array is ratio matched. A mismatch in the value of capacitance between top plate and bottom plate of a capacitor in the capacitor array, affects the DNL (differential non-linearity) and INL (integral non-linearity) of the ADC. Thus, whenever the plurality of capacitors in the capacitor array is not ratio matched, a single tone input to the ADC will result in harmonics at an output of the ADC.

Because of multiple factors, the plurality of capacitors is not ratio matched. These factors include, but not limited to, edge definition of the masking process, process variations and gradients across a chip. As technology is advancing at a rapid pace, the size of the capacitor is becoming smaller, and the parasitics due to bottom plate and top plate are becoming significant because of high integration.

SUMMARY

According to an aspect of the disclosure, a capacitor array is disclosed. The capacitor array includes one or more first metal plates vertically stacked parallel to each other. A second metal plate is horizontally stacked to couple one end of each first metal plate of the one or more first metal plates. One or more third metal plates are vertically stacked parallel to the one or more first metal plates. Each third metal plate of the one or more third metal plates is stacked between two first metal plates.

BRIEF DESCRIPTION OF THE VIEWS OF DRAWINGS

Figure 1:
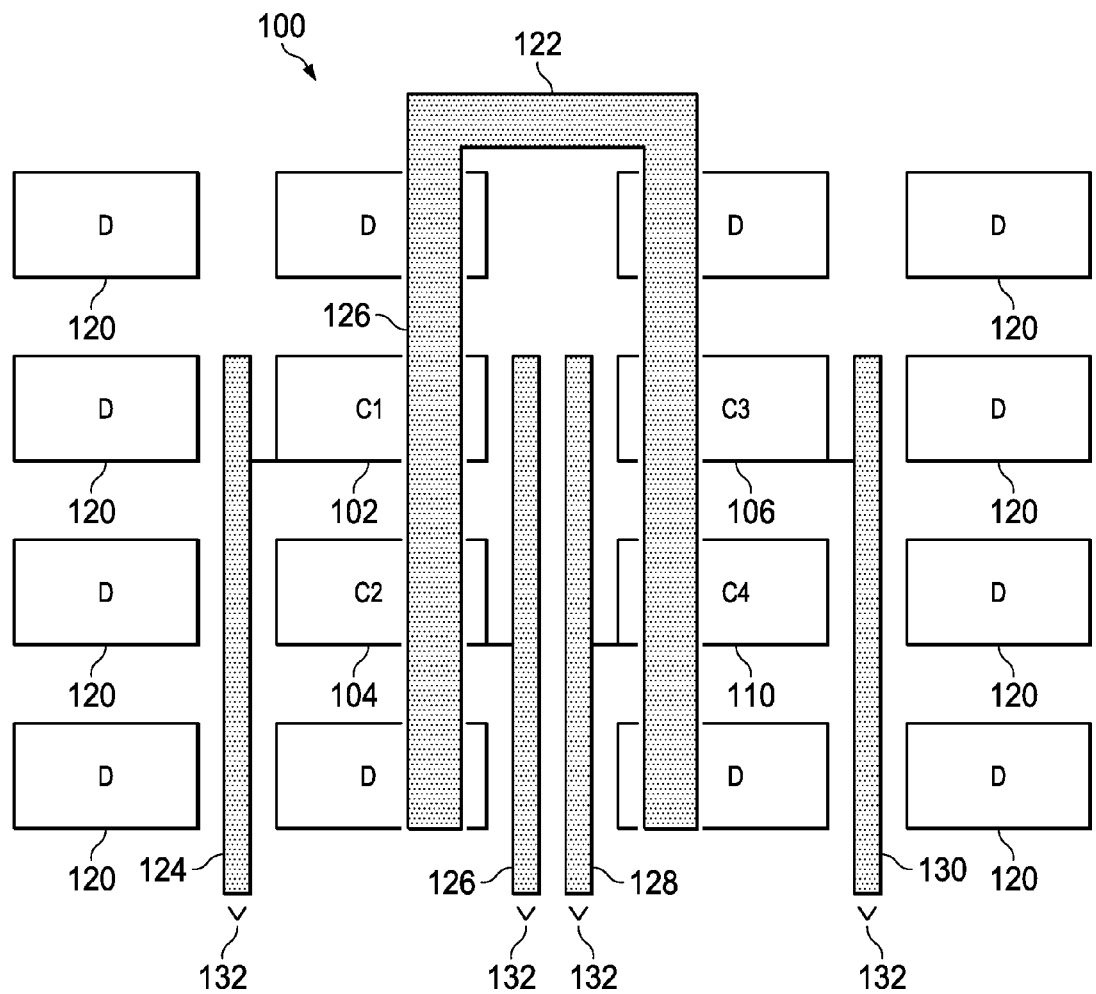
Figure 2:
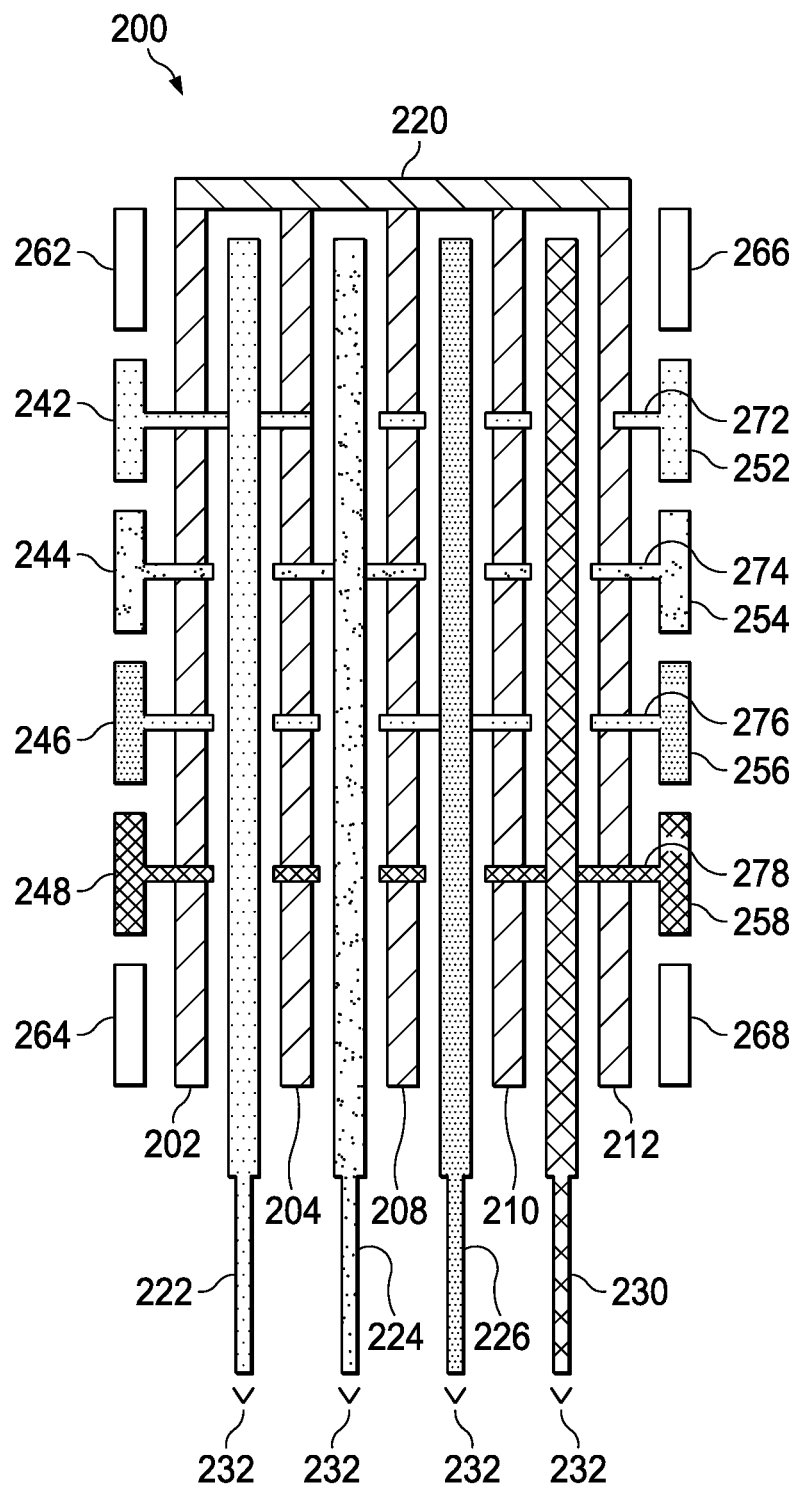
Figure 3:
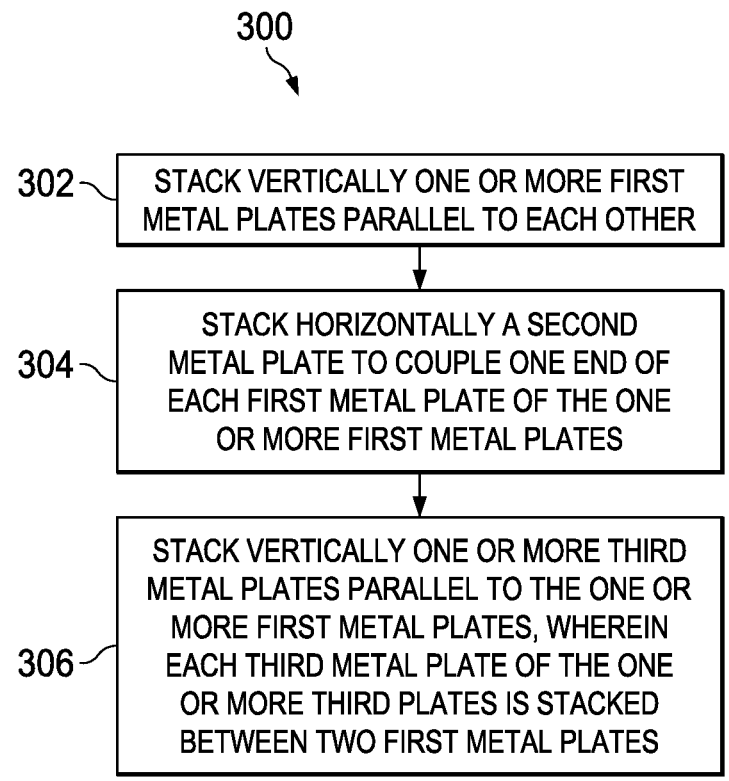
Figure 4:
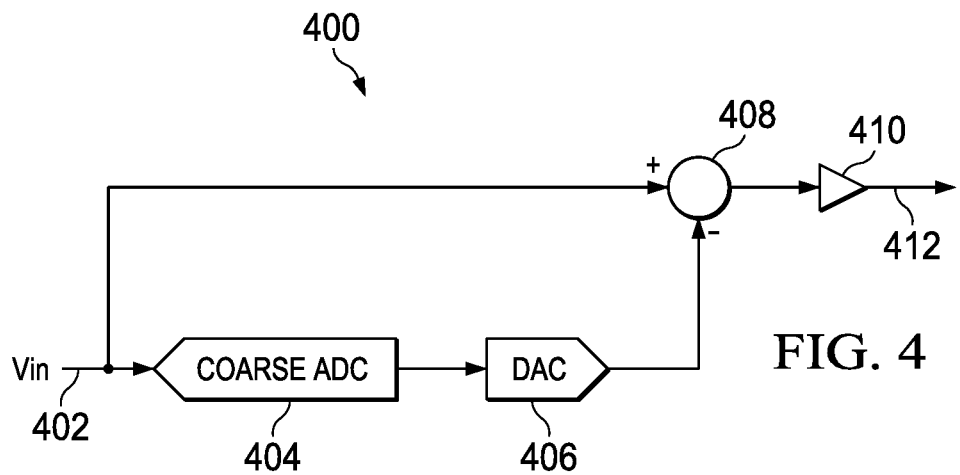

FIG. 1 illustrates a conventional capacitor array;
FIG. 2 illustrates a capacitor array, according to an embodiment;
FIG. 3 is a flowchart to illustrate a method of manufacturing a capacitor array, according to an embodiment; and
FIG. 4 illustrates an analog-to-digital converter (ADC), according to an embodiment.

DETAILED DESCRIPTION OF THE EMBODIMENTS

FIG. 1 illustrates a conventional capacitor array 100. The capacitor array 100 includes a plurality of capacitors illustrated as C1 102, C2 104, C3 106 and C4 110. The plurality of capacitors is surrounded by dummy capacitors illustrated as D 120. A first connector 122 couples top plates of the plurality of capacitors C1 102 to C4 110. The capacitor array 100 includes a plurality of second connectors illustrated as 124, 126, 128 and 130. The second connector 124 couples bottom plate of the capacitor C1 102 to a voltage source V 132. The voltage source V 132 provides at least one of a primary voltage, a secondary voltage and a reference voltage. The first connector 122 and the second connectors 124 to 130 are formed from a metal.

Similarly, the second connector 126 couples bottom plate of the capacitor C2 104 to the voltage source V 132. The second connector 128 couples bottom plate of the capacitor C4 110 to the voltage source V 132, and the second connector 130 couples bottom plate of the capacitor C3 106.

The capacitor array 100, in one example, is part of an analog-to-digital converter (ADC) (not shown). The first connector 122 is coupled to an amplifier in the ADC. A value of capacitance between top plate and bottom plate of each capacitor in the capacitor array 100 is required to be of same value. When this condition is met, the capacitor array 100 is ratio matched. The dummy capacitors illustrated as D 120 provides ratio matching of the plurality of capacitors C1 102 to C4 110. As the ratio matching of the plurality of capacitors C1 102 to C4 110 is dependent on the etching of the edges of the plurality of capacitors C1 102 to C4 110, the dummy capacitors D 120 ensure that all the capacitors of the plurality of capacitors C1 102 to C4 110 are uniformly etched.

However, the capacitor array 100 is affected by top plate and bottom plate parasitic capacitances. The parasitic capacitance is caused by the first connector 122 and the plurality of second connectors 124 to 130. While connecting the top plates of the plurality of capacitors C1 102 to C4 110, the first connector 122 traverses deep inside the capacitor array 100. Similarly, the plurality of second connectors 124 to 130 traverses deep inside the capacitor array 100. Thus, the first connector 122 and the plurality of second connectors 124 to 130 causes parasitic capacitances. In addition, the capacitor array 100 extends in X direction for a differential set-up which further impacts top level floor plan.

FIG. 2 illustrates a capacitor array 200, according to an embodiment. The capacitor array 200 includes one or more first metal plates illustrated as 202, 204, 208, 210 and 212. The one or more first metal plates 202 to 212 are vertically stacked parallel to each other. The outermost first metal plates are 202 and 212. 202 is a primary first metal plate, and 212 is a secondary first metal plate. The capacitor array 200 also includes a second metal plate 220. The second metal plate 220 is horizontally stacked to couple one end of each first metal plate of the one or more first metal plates 202 to 212. The second metal plate 220, as illustrated, couples top end of each first metal plate of the one or more first metal plates 202 to 212.

The capacitor array 200 also includes one or more third metal plates illustrated as 222, 224, 226 and 230. The one or more third metal plates 222 to 230 are vertically stacked parallel to the one or more first metal plates 202 to 212. Each third metal plate is stacked between two first metal plates. For example, the third metal plate 222 is stacked between the first metal plate 202 and the first metal plate 204. Similarly, the third metal plate 224 is stacked between the first metal plate 204 and the first metal plate 208.

In one version, a length of the one or more first metal plates 202 to 212 is equal to a length of the one or more third metal plates 222 to 230. For example, a length of the first metal plate 202 is equal to a length of the third metal plate 222. In another version, the length of the one or more first metal plates 202 to 212 is not equal to a length of the one or more third metal plates 222 to 230

In one example, the second metal plate 220 and each of the one or more first metal plates 202 to 212 comprise a first material. The capacitor array 200 also includes one or more first conductive bars illustrated as 242, 244, 246 and 248. The one or more first conductive bars 242 to 248 are stacked in parallel to the primary first metal plate 202. The capacitor array 200 also includes one or more second conductive bars 252, 254, 256 and 258. The one or more second conductive bars 252 to 258 are stacked in parallel to the secondary first metal plate 212. As illustrated, the primary first metal plate 202 and the secondary first metal plate 212 are outermost first metal plates in the capacitor array 200.

A number of the one or more first conductive bars 242 to 248 and a number of the one or more second conductive bars 252 to 258 is equal to a number of the one or more third metal plates 222 to 230. Also, as illustrated, the capacitor array 200 includes four first conductive bars, four second conductive bars and four third metal plates. A first conductive bar of the one or more first conductive bars 242 to 248, and a second conductive bar of the one or more second conductive bars 252 to 258 are coupled to a third metal plate of the one or more third metal plates 222 to 230. For example, the first conductive bar 242 and the second conductive bar 252 are coupled to the third metal plate 222 by a connector 272. The connector 272 is coupled to the third metal plate 222 through a via.

The first conductive bar 244 and the second conductive bar 254 are coupled to the third metal plate 224 by a connector 274. The connector 274 is coupled to the third metal plate 224 through a via. The first conductive bar 246 and the second conductive bar 256 are coupled to the third metal plate 226 by a connector 276. The connector 276 is coupled to the third metal plate 226 through a via. The first conductive bar 248 and the second conductive bar 258 are coupled to the third metal plate 230 by a connector 278. The connector 278 is coupled to the third metal plate 230 through a via. The capacitor array 200 also includes one or more first dummy bars 262 and 264. The one or more first dummy bars 262 and 264 are stacked in parallel to the primary first metal plate 202. The one or more first conductive bars 242 to 248 are stacked between the one or more first dummy bars 262 and 264.

The capacitor array 200 also includes one or more second dummy bars 266 and 268. The one or more second dummy bars 266 and 268 are stacked in parallel to the secondary first metal plate 212. The one or more second conductive bars 252 to 258 are stacked between the one or more second dummy bars 266 and 268. The capacitor array 200 may include one or more additional components known to those skilled in the relevant art and are not discussed here for simplicity of the description The capacitor array 200, in one example, is part of an analog-to-digital converter (ADC) (now shown). The second metal plate 220 is coupled to an amplifier in the ADC. Each third metal plate of the one or more third metal plates 222 to 230 are coupled to a voltage source V 232. The voltage source V 232 provides at least one of a primary voltage, a secondary voltage and a reference voltage. The first metal plates 202 and 204, the second metal plate 220 and the third metal plate 222 forms one capacitor in the capacitor array 200. The first metal plates 202 and 204 along with the second metal plate 220 forms a top plate of the capacitor, and the third metal plate 222 forms a bottom plate of the capacitor.

Similarly, the first metal plates 204 and 208, the second metal plate 220 and the third metal plate 224 forms one capacitor in the capacitor array 200. The first metal plates 204 and 208 along with the second metal plate 220 forms a top plate of the capacitor, and the third metal plate 224 forms a bottom plate of the capacitor.

The capacitor array 200 does not require dummy capacitors on top and bottom as any process variation will affect all the capacitors in a similar manner. A value of capacitance between top plate and bottom plate of each capacitor in the capacitor array 200 is required to be of same value. When this condition is met, the capacitor array 200 is ratio matched. Any etching on the top would affect all the capacitors in the capacitor array 200 equally. Also, any etching on the sides would affect both the first conductive bars 242 to 248 and the second conductive bars 252 to 258 equally. This provides ratio matching of all the capacitors in the capacitor array 200.

Also, the capacitor array 200 is not affected by top and bottom plate parasitic capacitances. The bottom plate parasitic is minimal as compared to the capacitor array 100 because there is no extra routing of the one or more third metal plates 222 to 230 in the capacitor array 200. The top plate parasitic is minimal as compared to the capacitor array 100 because the one or more first metal plates 202 to 212 and the second metal plate 220 does not traverse through any dummy bars 262, 264, 266 and 268. In addition, the capacitor array 200 extends minimal in X direction as compared to the capacitor array 100. Thus, the capacitor array 200 is a more viable option in terms of size and cost as compared to the capacitor array 100.

FIG. 3 is a flowchart 300 to illustrate a method of manufacturing a capacitor array, according to an embodiment. The flowchart 300 is explained in connection with the capacitor array 200 (illustrated in FIG. 2). At step 302, one or more first metal plates are vertically stacked parallel to each other. For example, in the capacitor array 200, the one or more first metal plates 202 to 212 are vertically stacked parallel to each other. The outermost first metal plates are 202 and 212. 202 is a primary first metal plate, and 212 is a secondary first metal plate.

At step 304, a second metal plate is horizontally stacked to couple one end of each first metal plate of the one or more first metal plates. In the capacitor array 200, the second metal plate 220 is horizontally stacked to couple one end of each first metal plate of the one or more first metal plates 202 to 212. The second metal plate 220, as illustrated, couples top end of each first metal plate of the one or more first metal plates 202 to 212.

At step 306, one or more third metal plates are vertically stacked parallel to the one or more first metal plates. Each third metal plate is stacked between two first metal plates. In capacitor array 200, the one or more third metal plates 222 to 230 are vertically stacked parallel to the one or more first metal plates 202 to 212. Each third metal plate is stacked between two first metal plates. For example, the third metal plate 222 is stacked between the first metal plate 202 and the first metal plate 204. Similarly, the third metal plate 224 is stacked between the first metal plate 204 and the first metal plate 208.

The first metal plates 202 and 204, the second metal plate 220 and the third metal plate 222 forms one capacitor in the capacitor array 200. The first metal plates 202 and 204 along with the second metal plate 220 forms a top plate of the capacitor, and the third metal plate 222 forms a bottom plate of the capacitor. Similarly, the first metal plates 204 and 208, the second metal plate 220 and the third metal plate 224 forms one capacitor in the capacitor array 200. The first metal plates 204 and 208 along with the second metal plate 220 forms a top plate of the capacitor, and the third metal plate 224 forms a bottom plate of the capacitor.

The capacitor array also includes one or more first conductive bars stacked in parallel to the primary first metal plate. The capacitor array also includes one or more second conductive bars stacked in parallel to the secondary first metal plate. For example, the capacitor array 200 includes one or more first conductive bars illustrated as 242, 244, 246 and 248. The one or more first conductive bars 242 to 248 are stacked in parallel to the primary first metal plate 202. The capacitor array 200 also includes one or more second conductive bars 252, 254, 256 and 258. The one or more second conductive bars 252 to 258 are stacked in parallel to the secondary first metal plate 212. As illustrated, the primary first metal plate 202 and the secondary first metal plate 212 are outermost first metal plates in the capacitor array 200.

A number of one or more first conductive bars and a number of one or more second conductive is equal to a number of one or more third metal plates. A first conductive bar of the one or more first conductive bars, and a second conductive bar of the one or more second conductive bars are coupled to a third metal plate of the one or more third metal plates. For example, the first conductive bar 242 and the second conductive bar 252 are coupled to the third metal plate 222 by a connector 272. The connector 272 is coupled to the third metal plate 222 through a via.

The capacitor array also includes one or more first dummy bars stacked in parallel to the primary first metal plate. The one or more first conductive bars are stacked between the one or more first dummy bars. The capacitor array also includes one or more second dummy bars. The one or more second dummy bars are stacked in parallel to the secondary first metal plate. The one or more second conductive bars are stacked between the one or more second dummy bars.

In one version, the capacitor array is part of an analog-to-digital converter (ADC). The second metal plate is coupled to an amplifier in the ADC. Each third metal plate of the one or more third metal plates is coupled to a voltage source. The voltage source provides at least one of a primary voltage, a secondary voltage and a reference voltage. The capacitor array, thus manufactured by these steps, does not require dummy capacitors on top and bottom as any process variation will affect all the capacitors in a similar manner. Also, the effect of top and bottom plate parasitic capacitances is minimal as compared to the capacitor array 100.

FIG. 4 illustrates an analog-to-digital converter (ADC) 400, according to an embodiment. The ADC 400 includes a coarse ADC 404, a digital-to-analog converter (DAC) 406, a subtractor 408 and an amplifier 410. The coarse ADC 404 receives an input signal Vin 402. The DAC 406 is coupled to the coarse ADC 404. The subtractor 408 is coupled to the DAC 406 and also receives the input signal Vin 402. The amplifier 410 is coupled to the subtractor 408. The ADC 400 may include one or more additional components known to those skilled in the relevant art and are not discussed here for simplicity of the description.

The operation of the ADC 400, illustrated in FIG. 4 is explained now. The coarse ADC 404 generates a coarse output in response to the input signal Vin 402. The DAC 406 generates a first analog signal in response to the coarse output from the coarse ADC 404. The subtractor 408 subtracts the first analog signal from the input signal Vin 402 to generate a residue signal. The amplifier 410 amplifies the residue signal to generate an amplified residue signal 412. The DAC 406 includes one or more capacitor arrays. At least one capacitor array of the one or more capacitor arrays is similar to the capacitor array 200.

A capacitor array in the DAC 406 includes one or more first metal plates are vertically stacked parallel to each other. For example, in the capacitor array 200, the one or more first metal plates 202 to 212 are vertically stacked parallel to each other. The outermost first metal plates are 202 and 212. 202 is a primary first metal plate, and 212 is a secondary first metal plate.

The capacitor array includes a second metal plate horizontally stacked to couple one end of each first metal plate of the one or more first metal plates. In the capacitor array 200, the second metal plate 220 is horizontally stacked to couple one end of each first metal plate of the one or more first metal plates 202 to 212. The capacitor array also includes one or more third metal plates vertically stacked parallel to the one or more first metal plates. Each third metal plate is stacked between two first metal plates. In capacitor array 200, the one or more third metal plates 222 to 230 are vertically stacked parallel to the one or more first metal plates 202 to 212. Each third metal plate is stacked between two first metal plates. For example, the third metal plate 222 is stacked between the first metal plate 202 and the first metal plate 204.

The first metal plates 202 and 204, the second metal plate 220 and the third metal plate 222 forms one capacitor in the capacitor array 200. The first metal plates 202 and 204 along with the second metal plate 220 forms a top plate of the capacitor, and the third metal plate 222 forms a bottom plate of the capacitor. Similarly, the first metal plates 204 and 208, the second metal plate 220 and the third metal plate 224 forms one capacitor in the capacitor array 200. The first metal plates 204 and 208 along with the second metal plate 220 forms a top plate of the capacitor, and the third metal plate 224 forms a bottom plate of the capacitor.

The capacitor array does not require dummy capacitors on top and bottom as any process variation will affect all the capacitors in a similar manner. Also, the effect of top and bottom plate parasitic capacitances is minimal as compared to the capacitor array 100.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A capacitor array comprising:
   one or more first metal plates vertically stacked parallel to each other;
   a second metal plate horizontally stacked to couple one end of each first metal plate of the one or more first metal plates; and
   one or more third metal plates vertically stacked parallel to the one or more first metal plates, wherein each third metal plate of the one or more third metal plates is stacked between two first metal plates, and wherein one or more first metal plates and the second metal plate forms a top plate of a capacitor in the capacitor array, and a third metal plate of the one or more third metal plates forms a bottom plate of the capacitor.

2. The capacitor array of claim 1, wherein the second metal plate is coupled to an amplifier.

3. The capacitor array of claim 1, wherein each third metal plate receives at least one of a primary voltage, a secondary voltage and a reference voltage.

4. The capacitor array of claim 1, wherein a length of the one or more first metal plates is equal to a length of the one or more third metal plates.

5. The capacitor array of claim 1, wherein the second metal plate and each of the one or more first metal plates comprises a first material.

6. The capacitor array of claim 1 further comprising:
   one or more first conductive bars stacked in parallel to a primary first metal plate of the one or more first metal plates; and
   one or more second conductive bars stacked in parallel to a secondary first metal plate of the one or more first metal plates, wherein the primary first metal plate and the secondary first metal plates are outermost first metal plates of the one or more first metal plates.

7. The capacitor array of claim 6, wherein a number of one or more first conductive bars and a number of one or more second conductive bars is equal to a number of the one or more third metal plates.

8. The capacitor array of claim 6, wherein a first conductive bar of the one or more first conductive bars and a second conductive bar of the one or more second conductive bars are coupled to a third metal plate of the one or more third metal plates.

9. The capacitor array of claim 6 further comprising one or more first dummy bars stacked in parallel to the primary first metal plate, and wherein the one or more first conductive bars are stacked between the one or more first dummy bars.

10. The capacitor array of claim 6 further comprising one or more second dummy bars stacked in parallel to the secondary first metal plate, and wherein the one or more second conductive bars are stacked between the one or more second dummy bars.

11. A method of manufacturing a capacitor array comprising:
    stacking vertically one or more first metal plates parallel to each other;
    stacking horizontally a second metal plate to couple one end of each first metal plate of the one or more first metal plates; and
    stacking vertically one or more third metal plates parallel to the one or more first metal plates, wherein each third metal plate of the one or more third metal plates is stacked between two first metal plates, and wherein one or more first metal plates and the second metal plate forms a top plate of a capacitor in the capacitor array, and a third metal plate of the one or more third metal plates forms a bottom plate of the capacitor.

12. The method of claim 11 further comprising coupling the second metal plate to an amplifier.

13. The method of claim 11 further comprising receiving at least one of a primary voltage, a secondary voltage and a reference voltage at each third metal plate.

14. The method of claim 11 further comprising:
    stacking one or more first conductive bars in parallel to a primary first metal plate of the one or more first metal plates; and
    stacking one or more second conductive bars in parallel to a secondary first metal plate of the one or more first metal plates, wherein the primary first metal plate and the secondary first metal plates are outermost first metal plates of the one or more first metal plates.

15. The method of claim 14, wherein a number of one or more first conductive bars and a number of one or more second conductive bars is equal to a number of the one or more third metal plates.

16. The method of claim 14 further comprising a first conductive bar of the one or more first conductive bar and a second conductive bar of the one or more second conductive bars are coupled to a third metal plate of the one or more third metal plates.

17. The method of claim 16 further comprising:
    stacking one or more first dummy bars in parallel to the primary first metal plate, the one or more first conductive bars are stacked between the one or more first dummy bars; and
    stacking one or more second dummy bars in parallel to the secondary first metal plate, the one or more second conductive bars are stacked between the one or more second dummy bars.

18. An analog-to-digital converter (ADC) comprising:
    a coarse ADC configured to generate a coarse output in response to an input signal;
    a digital-to-analog converter (DAC) configured to generate a first analog signal in response to the coarse output, the DAC comprising one or more capacitor arrays;
    a subtractor configured to subtract the first analog signal from the input signal to generate a residue signal; and
    an amplifier configured to amplify the residue signal to generate an amplified residue signal, wherein a capacitor array of the one or more capacitor arrays comprising:
        one or more first metal plates vertically stacked parallel to each other;
        a second metal plate horizontally stacked to couple one end of each first metal plate of the one or more first metal plates; and
        one or more third metal plates vertically stacked parallel to the one or more first metal plates, wherein each third metal plate of the one or more third metal plates is stacked between two first metal plates, and wherein one or more first metal plates and the second metal plate forms a top plate of a capacitor in the capacitor array, and a third metal plate of the one or more third metal plates forms a bottom plate of the capacitor.

19. The ADC of claim 18, wherein the capacitor array further comprises:
    one or more first conductive bars stacked in parallel to a primary first metal plate of the one or more first metal plates; and
    one or more second conductive bars stacked in parallel to a secondary first metal plate of the one or more first metal plates, wherein the primary first metal plate and the secondary first metal plates are outermost first metal plates of the one or more first metal plates.

20. The ADC of claim 19, wherein a number of one or more first conductive bars and a number of one or more second conductive bars is equal to a number of the one or more third metal plates.

* * * * *